United States Patent [19]

Kim et al.

[11] Patent Number: 4,849,377
[45] Date of Patent: Jul. 18, 1989

[54] ACTIVE AREA PLANARIZATION WITH SELF-ALIGNED CONTACTS

[75] Inventors: Manjin J. Kim; Bruce F. Griffing; Ronald H. Wilson, all of Schenectady; Arlene G. Williams, Scotia; Robert W. Stoll, Schenectady, all of N.Y.

[73] Assignee: General Electric Company, Schenectady, N.Y.

[21] Appl. No.: 866,648

[22] Filed: May 27, 1986

[51] Int. Cl.[4] .......................................... H01L 21/283
[52] U.S. Cl. .................................. 437/228; 437/235; 437/245
[58] Field of Search ................... 427/91, 99; 148/1.5, 148/6.3; 29/591

[56] References Cited

U.S. PATENT DOCUMENTS

| | | | |
|---|---|---|---|
| 4,429,011 | 1/1984 | Kim et al. | 427/96 |
| 4,471,004 | 9/1984 | Kim | 427/88 |
| 4,552,783 | 11/1985 | Stoll et al. | 427/91 |
| 4,584,207 | 4/1986 | Wilson | 427/124 |
| 4,597,167 | 7/1986 | Moriya | 427/91 |
| 4,653,428 | 3/1987 | Wilson et al. | 118/725 |

OTHER PUBLICATIONS

Okabayashi et al, "A Mo-Nitride/Mo Gate MOS Structure", Extended Abstracts of Battery Division, The Electrochemical Society, Inc., Spring Meeting, Minneapolis, Minnesota, May 10-15, 1901, Abstract No. 302, pp. 753-755.

M. J. Kim et al., "Molybdenum Nitride Film Formation", Reprinted from *Journal of the Electrochemical Society*, vol. 30, No. 5, May 1983, pp. 1196-1200.

Pauleau, Y. et al., "Kinetics and Mechanism of Selective Tungsten Deposition by LPCVD", *Journal of the Electrochemical Society*, vol. 132, p. 2779 (1985).

Primary Examiner—Norman Morgenstern

[57] ABSTRACT

Molybdenum gate electrode material is provided with an upper layer of molybdenum nitride which acts to prevent deposition of source and drain contact metal by selective chemical vapor deposition (CVD). The nitride layer also provides an improved mask for ion implantation process steps. This results in an FET structure exhibiting a high degree of planarity which is desirable for multilevel device fabrication.

16 Claims, 2 Drawing Sheets

ACTIVE AREA PLANARIZATION WITH SELF-ALIGNED CONTACTS

BACKGROUND OF THE INVENTION

The present invention is generally directed to a method for forming structures exhibiting a high degree of planarity in metal oxide semiconductor field effect transistors (MOSFETs). More particularly, the present invention is directed to a method for preventing deposition of source/drain contact material on conductive gate line patterns.

In the fabrication of very large scale integrated circuits (VLSI), it is desirable to be able to fabricate device structures as small as possible in order to maximize the number of active devices which may be disposed on a single integrated circuit chip. Scaling down of VLSI devices not only requires miniaturization of device features, but also requires the use of multilevel interconnections. Furthermore, the greater the need and number for multilevel connections, the greater becomes the necessity for providing planar device structures. The planarity requirement is a consequence of the difficulty of providing step coverage over highly non-planar features. Step coverage problems contribute to lower device yield during manufacture, poor device parameters and a greaer proclivity for failure during operation. Accordingly, it is seen that it is very desirable to provide planar device structures.

Since a large portion of the active area in an FET device is consumed by source and/or drain contacts, it becomes increasingly difficult to scale down the contact size without proportionally affecting gate dimensions. In this regard, it is to be generally noted that scaling device features as measured in square area units cannot generally be undertaken without also affecting height dimensions of circuit features. This is a direct consequence of the etching and lithography processes employed in the fabrication of VLSI devices.

With particular reference to problems solved by the present invention, it is to be noted that FET gate thickness should also be decreased to facilitate multilevel interconnection. It is therefore seen that it is desirable that gate electrode material not extend in height beyond the level generally associated with the field oxide region.

One of the methods employed to decrease device size is the utilization of selective chemical vapor deposition of metal on material comprising the active region of an FET device. However, chemical vapor deposited metal also is deposited on conductive gate structures comprising materials such as polycrystalline silicon or molybdenum. This increases gate height and produces an adverse effect on the desired planar structure. Also, in particular reference to the present invention, it is to be noted that molybdenum is a desirable metal for use as gate electrode material because of its low electrical resistivity and its mechanical properties which closely match those of silicon and related semiconductor materials, particularly with respect to its coefficient of thermal expansion.

SUMMARY OF THE INVENTION

In accordance with preferred embodiment of the present invention, a method for preventing deposition of metal by chemical vapor deposition on conductive molybdenum patterns, particularly in integrated circuit chip devices, comprises forming a layer of molybdenum nitride on the surface of the conductive patterns. In particular, the present inventors have discerned that a layer of molybdenum nitride provided on the surface of a molybdenum conductive pattern prevents the deposition thereon of metals such as tungsten during chemical vapor deposition. In this way, VLSI circuit devices may be fabricated which exhibit increased planarity. The formation of the nitride film may be performed either in an ammonia atmosphere or in an atmosphere of forming gas.

More particularly, the method of the present invention may be employed to fabricate integrated circuit devices exhibiting a high degree of planarity. For example, an active area is formed in a semiconductor body so as to be surrounded by electrically insulative material. A thin gate insulation layer is disposed on the active area over which is disposed a subsequent layer of molybdenum. In accordance with one embodiment of the present invention, a molybdenum nitride layer is provided on the gate electrode pattern so that in the gate region the layers comprise: a semiconductor substrate; a gate insulator; a molybdenum gate electrode; and a surface layer of molybdenum nitride, respectively. Insulative sidewall spacers are then provided on either side of the gate electrode structure and the active areas are doped on either side of the gate electrode structure to provide source and drain regions. In further conjunction with the present invention, metal contacts are then selectively deposited by chemical vapor deposition over the source and drain regions in the active area. As a consequence of the nitride layer provided by the present invention, deposition of contact material is selective to the source and drain regions and is not deposited upon the gate electrode. Accordingly, the height of the gate electrode can be maintained at a level substantially even with the level of the field oxide which provides electrical insulation between active device areas.

Accordingly, it is seen that it is an object of the present invention to provide a method for selective chemical vapor deposition of metal on source and drain regions of an FET device.

It is also an object of the present invention to provide a method for preventing deposition of metal by chemcal vapor deposition on conductive molybdenum circuit patterns.

It is also an object of the present invention to provide a method for fabricating integrated circuit devices employing molybdenum gates and selective deposition of source and drain contacts.

It is yet another object of the present invention to provide planarization of source and drain regions by selective CVD tungsten deposition without adversely effecting gate height.

It is a still further object of the present invention to provide simultaneous self alignment of source and drain contacts.

Lastly, but not limited hereto, it is an object of the present invention to provide reduction of source and drain contact resistance and smaller device size.

DESCRIPTION OF THE FIGURES

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION OF THE INVENTION

Figure 1:
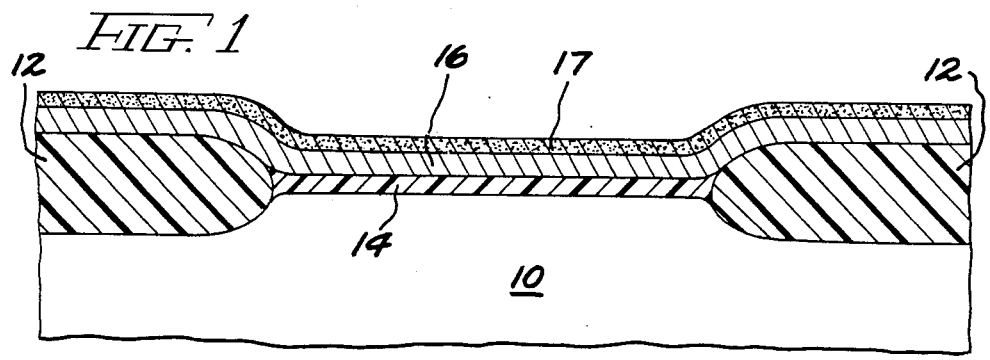
FIG. 1 is a cross-sectional, side elevation view illustrating an initial process stage in the fabrication of an FET device in accordance with a preferred embodiment of the present invention.

FIG. 1 illustrates an initial stage in a process in accordance with an embodiment of the present invention for FET device fabrication. In particular, FIG. 1 illustrates semiconductor body 10 (typically including a first polarity dopant) together with field oxide regions 12. Thin insulative layer 14, typically comprising silicon oxide, is disposed over the active area of substrate 10 which typically comprises silicon. Molybdenum layer 16, such as may be provided by sputtering, is seen disposed over the entire substrate. Then, in accordance with the present invention, thin layer 17 of molybdenum nitride is provided.

In accordance with the present invention, molybdenum nitride layer 17 may be provided either by the use of ammonia or the use of a mixture of nitrogen and hydrogen (forming gas). In particular, nitride layer 17 may be formed in an ammonia atmosphere at a temperature from between approximately 500° C. to approximately 900° C. As usual, thickness of nitride layer 17 is determined by temperature and process time. The use of an ammonia atmosphere is preferred herein for nitride formation. However, it is also possible to employ mixture of hydrogen and nitrogen as an ambient atmosphere at similar elevated temperature conditions for nitride formation. The formation of molybdenum nitride films is described in an article by M. J. Kim, D. M. Brown, and W. Katz titled "Molybdenum Nitride Film Formation" in the *Journal of Electrochemical Society* in Volume 130, No. 5, May 1983. This article is hereby incorporated herein by reference.

Figure 2:
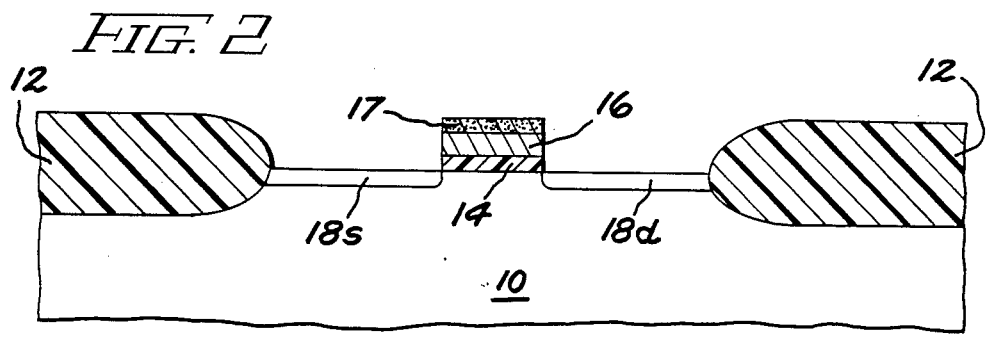
FIG. 2 is a cross-sectional, side elevation view similar to FIG. 1 illustrating patterning of gate electrode structures and ion implantation.

As a next step in device fabrication, the substrate materials shown in FIG. 1 are patterned and selectively removed through conventional masking process steps leaving gate electrode structure including gate insulative layer 14, gate electrode metal 16, and surface layer 17 of molybdenum nitride. The resulting structure is shown in FIG. 2. Alternatively, a pure molybdenum gate is patterned without molybdenum nitride layer 17 and the patterned gate is nitrided so that nitride covers the sidewalls as well. Since nitride is a good diffusion barrier against impurity, this further protects the gate from contamination. At this stage of device fabrication, it is also typically appropriate to lightly implant second polarity dopant ions into regions 18s and 18d as shown.

Figure 3:
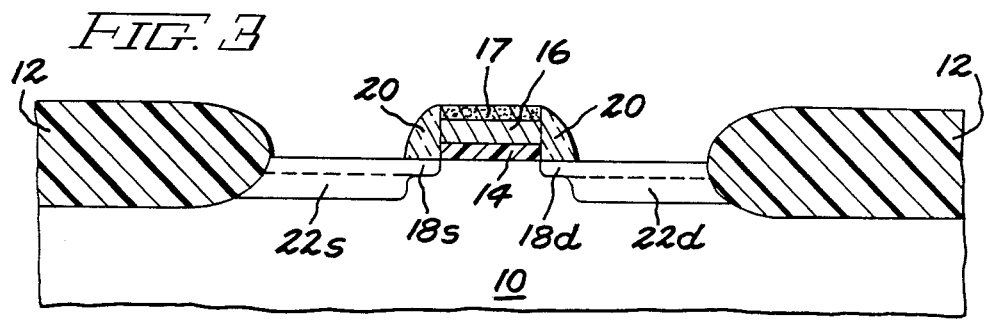
FIG. 3 is a cross-sectional, side elevation view similar to FIG. 2 illustrating the formation of sidewall spacers and doping of source and drain regions.

Next, the process substrate may be coated with a thin layer of silicon oxide and reactive ion etched to provide sidewall spacers 20 as seen in FIG. 3. At this stage, it is typically appropriate to perform a second, heavier implantation operation to produce more heavily doped source and drain regions 22s and 22d, respectively. Molybdenum nitride layer 17 provides an important function in this implantation process. In particular, while it is observed that molybdenum gate electrode materials generally exhibit columnar structures which undesirably facilitate ion channeling into the gate region during implantation, it is seen by the present inventors that the presence of nitride layer 17 significantly inhibits ion channeling and improves device characteristics. The shape of the resulting doped source and drain regions in substrate 10 is therefore seen to provide a certain amount of voltage grading between source and drain regions. The doping profile seen is partially a result of sidewall spacers 20 acting as a mask for implantation.

Figure 4:
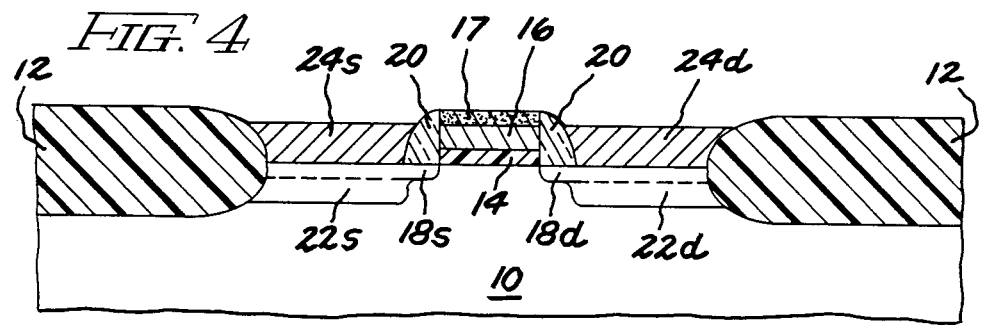
FIG. 4 is a cross-sectional, side elevation view similar to FIG. 3 more particularly illustrating the presence of chemically deposited metal source and drain contact material which is particularly seen to be absent from the gate structure.

Lastly, source and drain contacts 24s and 24d respectively, are provided by chemical vapor deposition of metals such as tungsten or molybdenum. See, for example, "Kinetics and Mechanism of Selective Tungsten Deposition by LPCVD" by Y. Pauleau and Ph. Lami, *Journal of the Electrochemical Society*, Vol. 132, page 2779 (1985). It is to be particularly noted in FIG. 4 that contact metal is not deposited on top of the gate electrode structure. This is a significant advantage in the present invention in that elevated height gate electrode structures are not present and the resulting device exhibits a much higher degree of planarity than is otherwise provided. For example, in conventional FET fabrication processes, field oxide 12 particularly extends above the active area by approximately 3,000 angstroms. In such processes, gate height typically approaches a level of 4,250 angstroms above the floor area of the active region. In contrast, the height of the gate electrode structures fabricated in accordance with the present invention can be reduced to approximately 1,250 angstroms, the height difference between the gate and field oxide when selectively deposited metal fills to the level of the field oxide.

It is also to be noted that molybdenum nitride layer 17 provides very effective ion implantation masking. In this regard, it is to be noted that a 3,000 angstrom thick layer of molybdenum cannot by itself block 90 keV arsenic atoms. However, molybdenum nitride layer 17 provides effective blocking in this area without requiring reduction of accelerating ion implantation potentials. The gamma phase molybdenum nitride provided herein converts a formerly columnar structure, which permits an undesirably high degree of ion channeling, to a polycrystalline structure which inhibits such channeling.

Also, the thickness of molybdenum gates as provided herein can be controlled to optimize the planarity of the active area. At 650° C., a 620 angstrom thick molybdenum nitride layer is formed during a ten minute reaction. Nitridation changes beta-phase molybdenum to gamma-phase molybdenum nitride which is face centered tetragonal. The small nitrogen atoms occupy the largest intersticies. According to scanning electron microscope analysis, molybdenum nitride changes the columnar crystal structure of molybdenum to polycrystalline nitride. These property changes reduce the surface reactivity with chemicals such as tungsten hexafluoride and oxygen.

Figure 5:
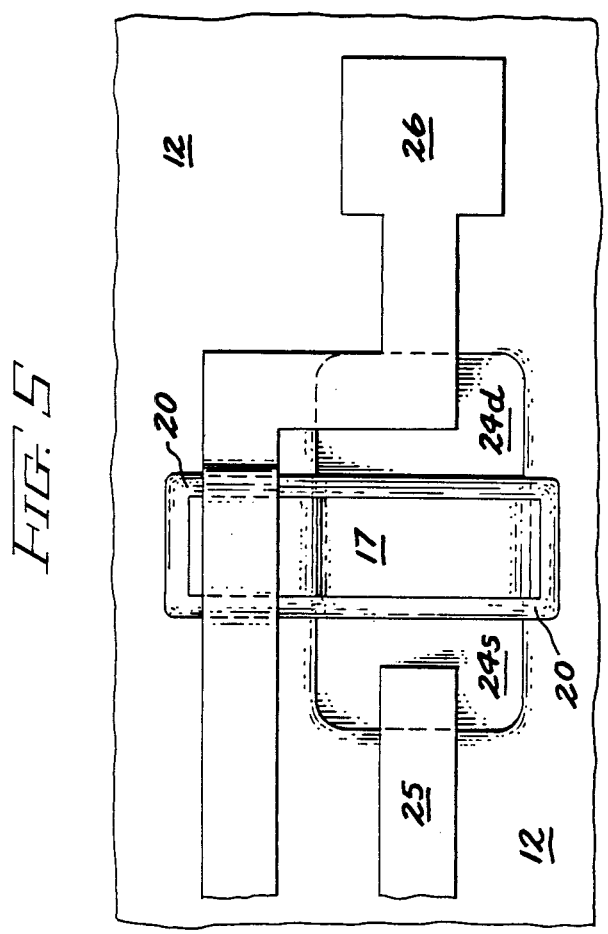
FIG. 5 is a planar view of a device similar to that shown in FIG. 4 which particularly illustrates metallization interconnection patterns.

FIG. 5 illustrates a planar view of a device fabricated in accordance with the present invention. FIG. 5 illustrates how gate, source, and drain regions can be locally interconnected. Conductive patterns 25 and 26 can be deposited and patterned with selective reactive ion etching. Since the thickness of conductors 25 and 26 is thin, the following dielectric deposition (not illustrated) does not show any significant step features. This facilitates subsequent multilevel metallization.

From the above, it is seen that the method of the present invention provides a means for proportioning FET devices with smaller dimensions without adversely producing gate height problems. It is also seen that the method of the present invention is generally applicable for preventing chemical vapor deposition of metals on molybdenum line patterns. Furthermore, it is also seen that the method of the present invention produces a means for fabrication of FET devices employing nitride formation and chemical vapor deposition of material such as tungsten which are entirely consonant with conventional VLSI fabrication methods. Lastly, it is seen that all the objects of the present invention are met.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A method for preventing deposition of metal by chemical vapor deposition on conductive molybdenum patterns disposed on a substrate, said method comprising:
   forming a layer of molybdenum nitride on the surface of said conductive molybydenum pattern prior to said chemical vapor deposition; and
   depositing a layer of metal over said substrate, whereby said metal is prevented form being deposited on those portions of said conductive molybdenum patterns on which said molybdenum nitride layer has been formed.

2. The method of claim 1 in which said metal comprises tungsten.

3. The method of claim 1 in which said nitride is formed in an ammonia atmosphere.

4. The method of claim 3 in which said nitride formation occurs at a temperature between approximately 500° C. and approximately 900° C.

5. The method of claim 1 in which said nitride formation occurs in an atmosphere comprising a mixture of hydrogen and nitrogen.

6. A method for fabricating integrated circuit devices, especially circuit devices exhibiting a high degree of planarity, said method comprising:
   forming an active area in a semiconductor body, said active area being surrounded by electrically insulative material;
   disposing a thin gate insulative layer on said active area;
   disposing a layer of molybdenum over said insulative gate layer in said active area;
   forming a molybdenum nitride layer on said molybdenum layer;
   patterning a gate electrode structure from said molybdenum, said insulative gate layer, and said molybdenum nitride layers by selective removal thereof so as to expose said active area on either side of said resulting gate electrode structure;
   forming insulative sidewall spacers on either side of said gate electrode structure;
   doping said active areas on either side of said gate electrode structure;
   depositing, by selective chemical vapor deposition, metal contacts in said active area, whereby said contact deposition is selective to said active area and does not increase the height of said gate structure.

7. The method of claim 6 further including a step of lightly doping said active area prior to said sidewall formation.

8. The method of claim 6 in which said contact metal comprises tungsten.

9. The method of claim 6 in which said nitride formation occurs in an ammonia atmosphere.

10. The method of claim 9 in which said nitride formation occurs at a temperature from between approximately 500° C. to approximately 900° C.

11. The method of claim 6 in which said nitride formation occurs in forming gas.

12. The method of claim 6 in which said semiconductor body comprises material doped with a dopant exhibiting opposite polarity with respect to dopants in said active area on either side of gate electrode structure.

13. The method of claim 6 further including a step of providing metallization contacts to said gate electrode material and to said metal contacts.

14. The method of claim 6 in which said semiconductor body comprises silicon.

15. The method of claim 6 in which said electrically insulative material surrounding said active area comprises silicon oxide.

16. A method for fabricating integrated circuit devices, especially circuit devices exhibiting a high degree of planarity, said method comprising:
   forming an active area in a semiconductor body, said active area being surrounded by electrically insulative material;
   disposing a thin gate insulative layer on said active area;
   disposing a layer of molybdenum over said insulative gate layer in said active area;
   patterning a gate electrode structure from said molybdenum and said insulative gate layer by selective removal thereof so as to expose said active area on either side of said resulting gate electrode structure;
   forming a molybdenum nitride layer on said molybdenum gate electrode structure;
   forming insulative sidewall spacers on either side of said gate electrode structure;
   doping said active areas on either side of said gate electrode structure;
   depositing, by selective chemical vapor deposition, metal contacts in said active area, whereby said contact deposition is selective to said active area and does not increase the height of said gate structure.

* * * * *